(12) United States Patent
Kato

(10) Patent No.: US 7,283,252 B2
(45) Date of Patent: Oct. 16, 2007

(54) MEASURING METHOD AND APPARATUS USING INTERFERENCE, EXPOSURE METHOD AND APPARATUS USING THE SAME, AND DEVICE FABRICATION METHOD

(75) Inventor: Seima Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 379 days.

(21) Appl. No.: 10/996,381

(22) Filed: Nov. 26, 2004

(65) Prior Publication Data

US 2005/0117171 A1    Jun. 2, 2005

(30) Foreign Application Priority Data

Nov. 28, 2003   (JP)   .............................. 2003-399216

(51) Int. Cl.
*G01B 11/02* (2006.01)
*G01B 9/02* (2006.01)

(52) U.S. Cl. ...................... 356/515; 356/521
(58) Field of Classification Search ................ 356/489, 356/495, 512, 515, 521; 355/55
See application file for complete search history.

(56) References Cited

U.S. PATENT DOCUMENTS

| | | | | |
|---|---|---|---|---|
| 4,832,489 A | 5/1989 | Wyant et al. | ................ | 356/359 |
| 5,457,533 A | 10/1995 | Wilcken | ...................... | 356/354 |
| 5,657,125 A | 8/1997 | Kato et al. | ................... | 356/356 |
| 5,835,217 A | 11/1998 | Medecki | ..................... | 356/353 |
| 6,151,115 A | 11/2000 | Naulleau | ..................... | 356/354 |
| 6,195,169 B1* | 2/2001 | Naulleau et al. | ............ | 356/498 |
| 6,312,373 B1 | 11/2001 | Ichihara | ...................... | 513/359 |
| 6,456,382 B2 | 9/2002 | Ichihara et al. | ............. | 356/513 |
| 6,559,952 B1* | 5/2003 | Bokor et al. | ................ | 356/520 |
| 6,765,683 B2 | 7/2004 | Ichihara | ...................... | 356/521 |
| 2001/0028462 A1 | 10/2001 | Ichihara et al. | ............. | 356/512 |
| 2002/0191195 A1 | 12/2002 | Ichihara et al. | ............. | 356/521 |
| 2003/0215053 A1 | 11/2003 | Ichihara | ...................... | 378/36 |

FOREIGN PATENT DOCUMENTS

| | | |
|---|---|---|
| EP | 1 063 570 A2 | 12/2000 |
| JP | 57-64139 | 4/1982 |
| JP | 2000-97666 | 4/2000 |

OTHER PUBLICATIONS

European Search Report dated Nov. 3, 2005, issued in corresponding European patent appln. No. EP 04 25 7382, forwarded in a Communication dated Nov. 25, 2005.

(Continued)

*Primary Examiner*—Patrick Connolly
(74) *Attorney, Agent, or Firm*—Fitzpatrick, Cella, Harper & Scinto

(57) ABSTRACT

A measuring method for measuring an interference fringe includes the steps of generating a reference wave as a result of transmission through a slit or pinhole in a mask of a portion of light that has passed a target optical system, generating the interference fringe between the reference wave and a wave of another portion of light that has passed the target optical system and contains aberration information of the target optical system, determining whether contrast of the interference fringe is higher than a predetermined threshold, and exchanging the pinhole or the slit when the contrast is below the predetermined threshold.

7 Claims, 8 Drawing Sheets

OTHER PUBLICATIONS

*Optical Shop Testing*, ed. by Daniel Malacara. "Chapter 8. Foucault, Wire, and Phase Modulation Tests," by J. Ojeda-Castañeda, and "Chapter 9. Ronchi Test" by A. Cornejo-Rodriguez, 1978: John Wiley and Sons, New York. pp. 231-322.

Communication pursuant to Article 96(2) EPC dated Feb. 7, 2007, issued in corresponding European patent application No. 04 257 382.4.

* cited by examiner

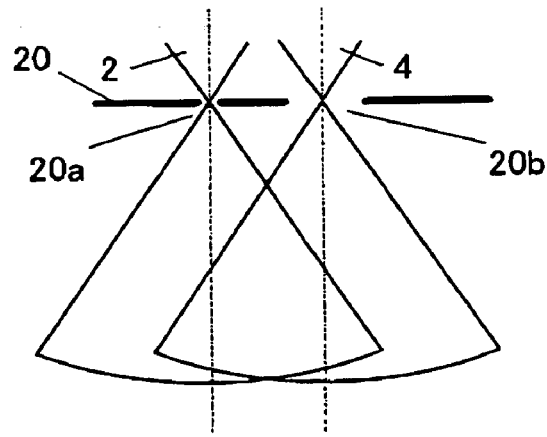 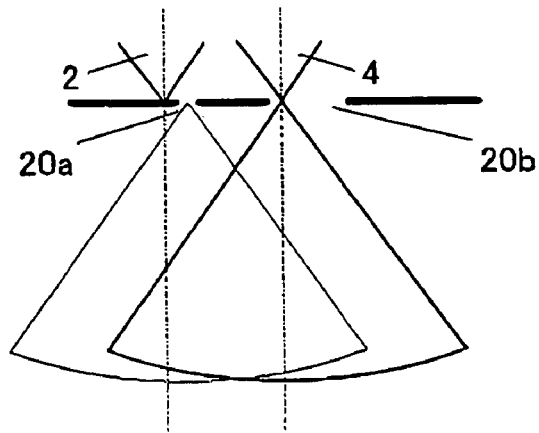
FIG. 6A     FIG. 6B
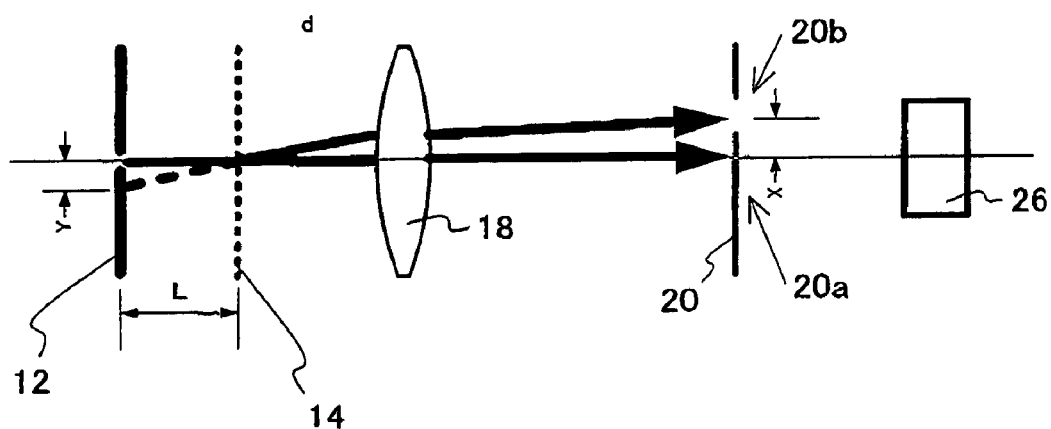
FIG. 7

MEASURING METHOD AND APPARATUS USING INTERFERENCE, EXPOSURE METHOD AND APPARATUS USING THE SAME, AND DEVICE FABRICATION METHOD

This application claims the right of priority under 35 U.S.C. § 119 based on Japanese Patent Application No. 2003-399216, filed on Nov. 28, 2003, which is hereby incorporated by reference herein in its entirety as if fully set forth herein.

BACKGROUND OF THE INVENTION

The present invention relates generally to a measuring method and apparatus, and, more particularly, to a measuring method and apparatus for measuring a wavefront aberration of a projection optical system that transfers a pattern of a mask onto an object using Point Diffraction Interferometry (PDI) or Line Diffraction Interferometry (LDI), and an exposure method and apparatus using the same. The measuring method and apparatus of the present invention is suitable, for example, to measure a projection optical system used for the exposure apparatus using EUV (Extreme Ultraviolet) light.

When semiconductor devices, for example, are manufactured in a photolithography process, an exposure apparatus that transfers a pattern formed on a mask onto an object is used. It is demanded that the exposure apparatus accurately transfer a pattern on a reticle onto an object to be exposed with a predetermined magnification, and thus, it is important that the exposure apparatus uses a projection optical system with good imaging performance that suppresses an aberration. Especially, because finer processing to a semiconductor device has been demanded in recent years, the transfer pattern has become sensitive to an aberration of the optical system. Therefore, there is a demand for highly accurate measurements of a wavefront aberration of a projection optical system.

The PDI using a pinhole is conventionally known for an apparatus that accurately measures a wavefront aberration of a projection optical system (for example, see Japanese Patent Application Publication No. 57-64139, U.S. Pat. No. 5,835,217 and Daniel Malacara, "Optical Shop Testing", John Wiley & Sons, Inc., 231 (1978)). Moreover, not only is the PDI technique known, but also, the LDI is known (for example, see Japanese Patent Application Publication No. 2000-097666).

However, the inventor of this patent application has discovered that conventional PDI and LDI techniques have the following two problems against a wavefront aberration measurement with high accuracy.

The first problem is that a contamination often influences the pinhole and slit that generate a reference wave. For instance, the PDI technique generates a spherical wave by using the pinhole as the reference wave. To form an ideal spherical wave, a diameter of the pinhole is decided by a wavelength of the measuring light and by a diffraction limit of the ideal spherical wave given by the numerical aperture (NA) of a target optical system, which is given by $\lambda/2NA$. When the PDI measurement uses EUV light, it is necessary to reduce the pinhole diameter to about 30 to about 50 nm. Such a minute pinhole is subject to contamination. The LDI technique can generate a similar problem. For instance, when the EUV light is used as the measuring light, a hydrocarbon component included in the residual gas in the vacuum, for example, produces carbon as a result of chemical reactions with the EUV light, and clogs the pinhole. The clogged pinhole reduces the contrast and causes an interference fringe to disappear. The pinhole deforms during clogging, and a point diffracted light as a reference wavefront shifts from the spherical wave by a change of a pinhole shape. This causes an erroneous detection in a wavefront analysis of the projection optical system.

The second problem is that the pinhole shifts from a condensing point of light. (This shift will be called "drift" in this specification.) Typical drift examples include time-sequential drifting of the pinhole mask and drifting of the incident light. The former is generated by the measuring light, and the pinhole mask in which the pinhole thermally deforms. The latter occurs when a light source position changes with time due to heat, for example. In any case, the contrast of the interference fringe decreases, because pinhole transmitting light decreases, and causes the above problem. A similar problem can occur in the slit for the LDI.

BRIEF SUMMARY OF THE INVENTION

Accordingly, it is an exemplary object of the present invention to provide a measuring method and apparatus that can, more accurately than in the conventional art, measure the wavefront of the target optical system using interferometry, and to provide an exposure method and apparatus using the same, and a device fabrication method.

A measuring method of one aspect according to the present invention for measuring an interference fringe includes the steps of generating the interference fringe between light that has passed a target optical system, and a reference wave that is generated from part of the light that has passed a mark, determining whether contrast of the interference fringe is higher than a predetermined threshold, and changing a condition of generating the reference wave when the contrast is below the predetermined threshold.

An exposing method of another aspect according to the present invention includes the steps of calculating a wavefront aberration of a target optical system by using a measuring method, adjusting the optical system based on the wavefront aberration of the calculated optical system, and exposing an object to be exposed with the adjusted optical system, wherein the measuring method for measuring an interference fringe includes the steps of generating the interference fringe between light that has passed a target optical system, and a reference wave that is generated from part of the light has passed a mask, determining whether contrast of the interference fringe is higher than a predetermined threshold, and changing a condition of generating the reference wave when the contrast is below the predetermined threshold.

A measuring apparatus of another aspect according to the present invention, for measuring a wavefront of a target optical system, includes a mask for generating a reference wave using part of light from the optical system, a measuring part for measuring an interference fringe between the reference wave and the light, a determining part for determining whether contrast of the interference fringe is higher than a predetermined threshold, and a changing part for changing a condition of generating the reference wave.

An exposure apparatus of another aspect according to the present invention, for exposing a pattern formed on a mask onto an object to be exposed by using a light beam, includes a projection optical system for projecting the pattern onto the object, and a measuring apparatus for detecting a wavefront aberration of the projection optical system by using the light beam and interference, wherein the measuring apparatus includes a mask for generating a reference wave using part of the light from the optical system, a measuring part for measuring an interference fringe between the reference wave and the light, a determining part for determining whether contrast of the interference fringe is higher than a predetermined threshold, and a changing part for changing a condition of generating the reference wave.

A device fabrication method of another aspect according to the present invention including the steps of exposing an object using an exposure apparatus, and performing a development process for the object exposed, wherein the exposure apparatus, for exposing a pattern from on a mask onto an object to be exposed by using a light beam, includes a projection optical system for projecting the pattern onto the object, and a measuring apparatus for detection a wavefront aberration of the projection optical system by using the light beam and interference, wherein the measuring apparatus includes a mask for generating a reference wave using part of the light from the optical system, a measuring part for measuring an interference fringe between the reference wave and the light, a determining part for determining whether contrast of the interference fringe is higher than a predetermined threshold, and a changing part for changing a condition of generating the reference wave.

Other objects and further features of the present invention will become readily apparent from the following description of the preferred embodiments with reference to the accompanying drawings.

BRIEF DESCRIPTION OF THE DRAWINGS

FIGS. 6A and 6B are optical path views for explaining a problem of the PDI.

FIG. 7 is an expanding imitative view of an optical path of the PDI shown in FIG. 3.

With reference to FIGS. 4A-4D, a description will be given of a measuring apparatus 100 using a PDI technique of the instant embodiment. Here, FIG. 4A is an optical path view of a measuring apparatus 10. The measuring apparatus 10 includes a first mask 12, a light divider 14, such as a diffraction grating, a phase-shift method 16, a projection optical system 18, such as a target optical system, a pinhole mask 20, such as a second mask, a stage 22 for mounting and driving the second mask 20, a changer 24, a detector 26, and a controller 28.

The first mask 12 arranges a pinhole 12a for a spherical wave generation on an object side, as shown in FIG. 4B. Here, FIG. 4B is a schematic plan view of the first mask 12. The second mask 20 is for the spherical wave generation on an image side, and includes a pinhole 20a and a window 20b that allow the measuring light to be detected, as shown in FIG. 4C.

The second mask 20 may have many pairs of pinholes 20a and windows 20b. In this case, only a couple of the pinholes 20a and the windows 20b contribute to measurement, regardless of a configuration shown in FIG. 4D. Here, FIG. 4C is a schematic plan view of a mask 6 for generating the spherical wave at the image side. The changer 24 changes a condition that the pinhole 20a in the second mask 20 generates a spherical wave. Concretely, the changer 24 in this embodiment exchanges the second mask 20, changes the combination of the pinholes 20a and windows 20b in the mask 20 into another one, or moves the second mask 20 and aligns the pinhole 20a with a condensing point of the zeroth order beam. The detector 26 is a detector or a camera, such as a backlight type CCD, as a means for observing an interference fringe. The controller 28 not only controls each part, but also acquires the contrast of the interference fringe detected by the detector 26, and judges whether it is below a predetermined threshold $\xi$. The controller 28 analyzes a wavefront, and acquires a wavefront aberration of the projection optical system 18. The controller 28 has a memory that stores $\xi$, $\delta$, and a flowchart, shown in FIG. 3, for a reason of comparison, to be described later.

A condenser system (not shown) condenses light generated by a light source (not shown) at the pinhole 12a in the first mask 12. The measuring light that has passed the pinhole 12a forms a reference spherical wave and directs the wave to the projection optical system 18. A diffraction grating 14, which is arranged between the first mask 12 and the projection optical system 18, is arranged parallel to a direction perpendicular to the paper surface, divides the measuring light longitudinally in the paper surface, and turns the light toward an orientation corresponding to the pitch of the diffraction grating. Each diffracted beam condenses on the image surface according to the projection optical system 18. The zeroth order beam that has a large amount of light is condensed at the pinhole 20a in the second mask 20, and the first diffracted order beam that has a small amount of light is condensed at a window 20b among the light condensed by the projection optical system 180. The zeroth order beam becomes a spherical wave without an aberration by passing the pinhole 20a, among two lights that have passed the second mask 20. The first diffracted order beam becomes a wavefront including aberration information, because it passes the window 20b that has an opening part sufficiently larger than a diffraction limit. The zeroth order beam 2 and the first diffracted order beam 4 form an interference fringe (a target wavefront TW) after passing the second mask 20 as shown in FIG. 6A, and this interference fringe is observed by the detector 26. Here, FIG. 6A is a pattern view for explaining the interference of the zeroth order beam 2 and the first diffracted order beam. Under this condition, when the diffraction grating 14 is scanned in the Y-axis direction via the phase-shift method 16, the diffracted beam is subject to the phase shift, and an aberration of the projection optical system 18 can be measured.

Figure 1:
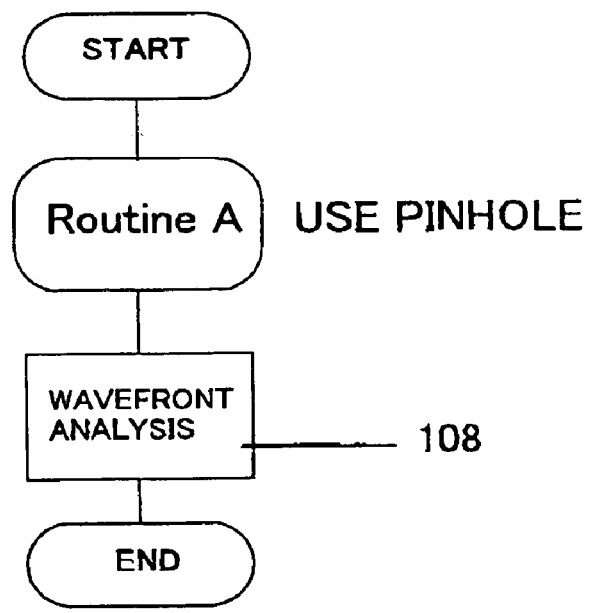
FIG. 1 shows a measuring flowchart of a PDI technique.

The pinhole 12a in the first mask 12 and the pinhole 20a of the second mask 20 are very small, and the wavefront of the light is close to the ideal spherical wave after the light passes the pinhole. Therefore, an absolute value of an aberration of the projection optical system 14 can be guaranteed with accuracy. High reproducibility can be achieved because the zeroth order beam and the first diffracted order beam almost pass the same optical path.

In the conventional PDI technique, a center of the pinhole 20a and a content of a condensing point shift, as shown in FIG. 6B, when a relative positional offset between the pinhole 20a and the condensing point of the zeroth order beam (drift) exists. Here, FIG. 6B is a pattern view for explaining the position of the zeroth order beam, the first diffracted order beam, and the second mask 20 when the drift exists. As a result, the contrast of the interference fringe decreases, because the transmitting light amount that transmits through the pinhole 20a decreases. The contrast of the interference fringe decreases, because the transmitting light amount that transmits through the pinhole 20a decreases, even when the pinhole 20a is clogged.

Figure 3:
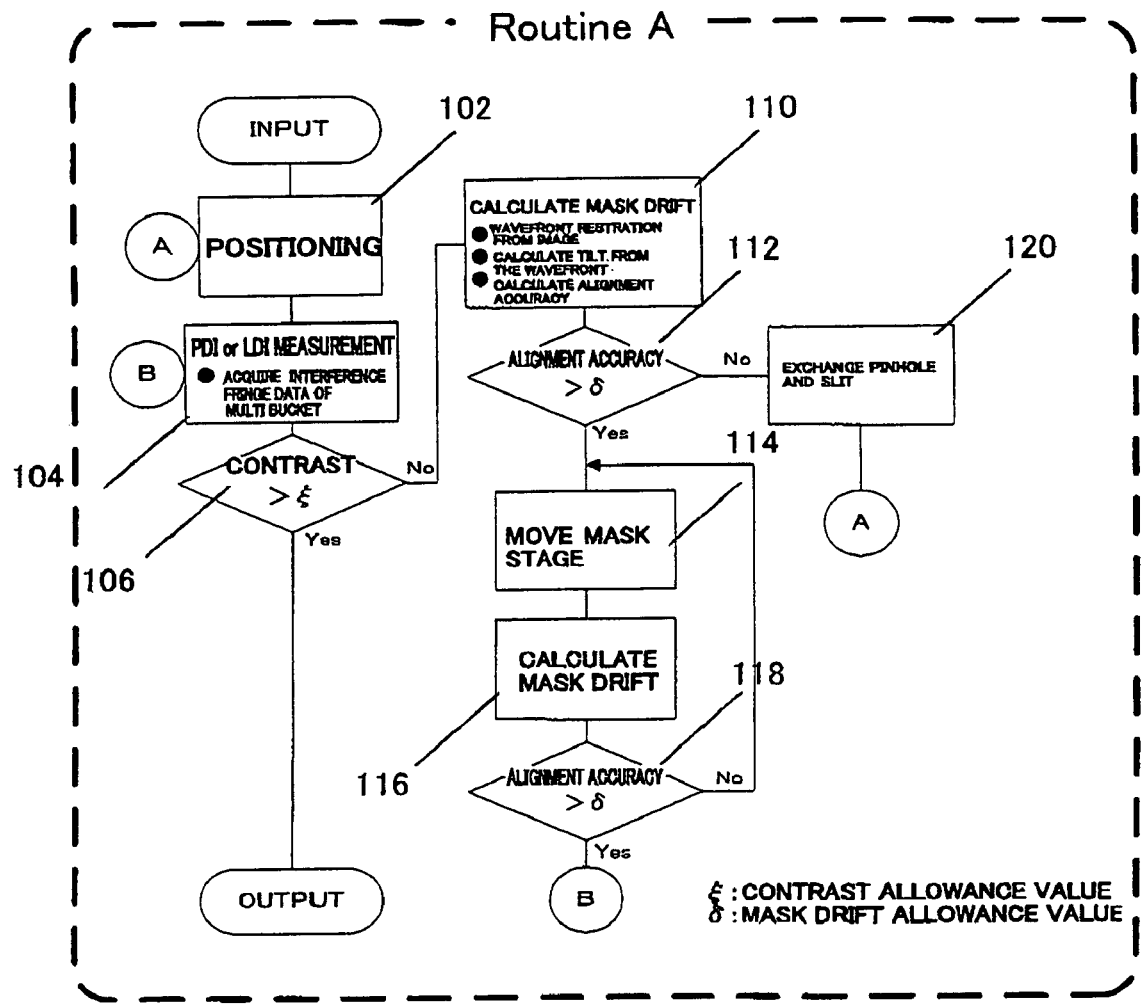
FIG. 3 is a flowchart for explaining a measuring method of an embodiment according to the present invention.
Figure 4A:
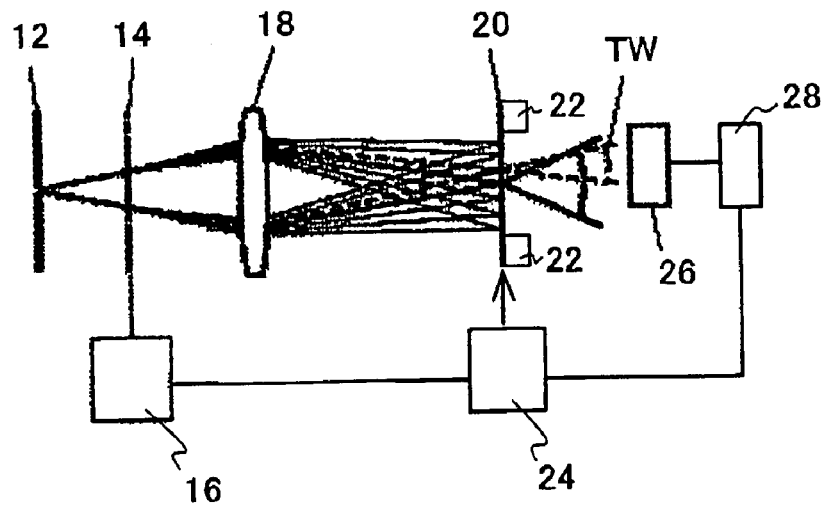
FIGS. 4A-4D are optical path views for explaining the PDI of an embodiment according to the present invention.
Figure 4B:
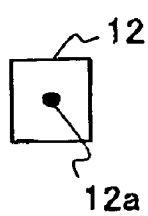
Figure 4C:
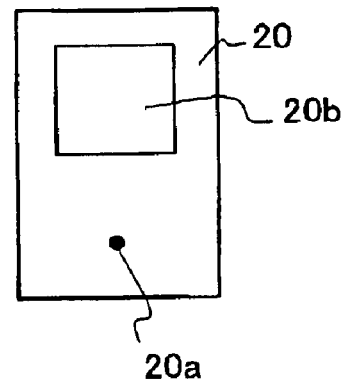
Figure 4D:
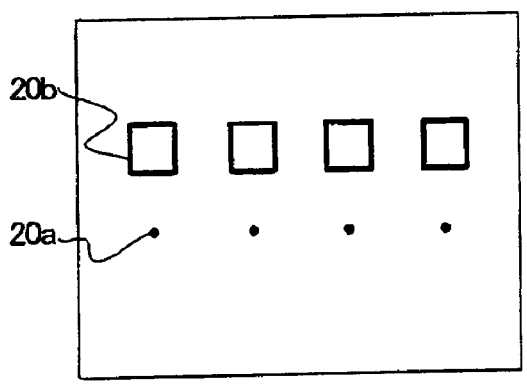

In this embodiment, when a decrease in the contrast originates from the drift, the changer 24 moves the second mask 20, so that alignment between the pinhole 20a of the second mask 20 and a condensing point of the zeroth order beam has a predetermined accuracy. On the other hand, when a decrease in the contrast originates from the clogged pinhole 20a, the changer 24 exchanges the second mask 20 or exchanges a combination of the pinhole and the windows on the mask 20 in this embodiment. Referring to FIG. 3, an operation of this embodiment is explained as follows. Here, FIG. 3 is a flowchart for explaining a measuring method of this embodiment.

In the PDI technique, a wavefront aberration is measured in accordance with the flow of FIG. 1. A wavefront is analyzed (step 108) through "Routine A", and the wavefront aberration of the projection optical system 18 is acquired. In "Routine A" in FIG. 1, the controller 28 drives the stage 22 through the changer 24, and the pinhole 20a positions in the second mask 20 (step 102). The PDI measurement follows, and the interference fringe data of a multi bucket is acquired by the detector 26 (step 104). "The PDI or the LDI measurement" is described in step 104 in FIG. 3, because the embodiments and the drawings of the LDI technique described later are shared. In this embodiment, this step 104 is a PDI measurement. Next, the controller 28 judges whether the contrast acquired by the detector 26 is higher than a predetermined threshold or a permissible value ξ (step 106). "Routine A" operation ends when the contrasts are higher than the ξ, and controller 28 analyzes the wavefront (step 108), and acquires the wavefront aberration of the projection optical system 18. The controller 28 shifts to step 110 when ξ is below the contrast.

In step 100, the controller 28 estimates a tilt component on the wavefront from the interference fringe measured wavefront, and estimates an amount of a relative positional offset at a center between the pinhole 20a and the condensing point from the value. It is fed back to the stage 22 (steps 114-118) when the amount of a relative positional offset is higher than a permissible value δ (step 112) and the procedure shifts to step 104. The factor of the decrease in the contrast is only clogging of the pinhole when the fed information is sent back to the stage 22. The controller 28 exchanges the pinhole 20a in the second mask by the changer 24 (step 120), and returns to step 102 when the contrast is below a permissible value ξ (step 104), and the amount of the relative positional offset is below a permissible value δ (step 112). Here, the method of setting the permissible value ξ of the contrast and a permissible value δ of the mask drift are explained. In the five buckets method, the measuring wavefront Φ is generated from interference fringes I1-I5 that shift the phase by the following equation.

$$\tan\phi = \frac{-I_1 + 4I_2 - 4I_4 + I_5}{I_1 + 2I_2 - 6I_3 + 2I_4 + I_5}$$

The interference fringes I1-I5 are intensities of the interference fringes when the diffraction grating of FIG. 7 is shifted respectively per ¼ pitches. Here, FIG. 7 is expanding an imitative view of the optical path of the PDI system. At this time, the following equation is met.

$$\Delta\tan\phi_{rms} \cong \Delta\phi_{rms} = \sqrt{\sum_{i=1}^{5}\left(\frac{\delta\phi}{\delta I_i}\Delta I_i\right)^2}$$

The following equations are met, when a fitting error of the wavefront aberration is ΔXrms for the contrast of ξ.

$$\Delta X_{rms} = \frac{13.5}{2\pi}\Delta\phi_{rms}$$

When ΔXrms=0.1 nm and ΔIi has a swing of thirty-three counts, a permissible value ξ of the contrast becomes 0.4. It is assumed that an intensity distribution f(x, y) of a condensing point beam in a surface of mask 20 is defined by the following equation.

$$\iint_{all} f(x, y)dxdy = 1$$

Transmitting light T of the pinhole 20a is shown by the following equation if the mask drift is δ in the X-direction. However, an integrating range is within the pinhole diameter.

$$T = \iint_{pinhole} f(x-\delta, y)dxdy$$

At this time, the contrast is shown by the next equation.

$$\xi = \frac{2\sqrt{T(1-T)}}{T+(1-T)}$$

Equations 5 and 6 provide a relationship between the contrast ξ and the mask drift δ. When F is a Gaussian function having a mesial magnitude width of 30 nm, the pinhole diameter is 50 nm, and the contrast allowance value ξ is 0.4, the mask drift of 55 nm is roughly allowed in the ideal condition. In FIG. 3, a relative positional offset at a condensing point of the light and the pinhole 20a is described as alignment accuracy.

A description will be given of the details in each step shown in FIG. 3 as follows. The PDI measuring system shown in FIG. 7 is used for the explanation.

In positioning the stage 22 (step 102), a condensing point of the target optical system 18 by the zeroth order beam of the diffraction grating 14 is positioned to a center of the pinhole 20a in the pinhole mask 20. At this time, the condensing point of the first order beam is positioned to the center of the window 20b in the pinhole mask 20, and the distance X is shown by the next equation:

$$X = \frac{Y}{20} = \frac{L\lambda}{20d}.$$

The PDI measurement (step 104) measures five, nine or more sheets of interference fringes using a CCD by moving the lattice shown in FIGS. 4 and 7 per a ¼ and a ⅛ lattice interval, according to the phase-shift method. When first the interference fringes are measured, the contrast decrease caused by the clogging pinhole 20a and the positional offset of the stage 22 is below a permissible value. The clogging pinhole 20a and the positional offset of the stage 22 may cause decreased contrast of the interference fringe as the number of measurements increases. The judgment of the contrast (step 106) shifts to step 110 when the contrast of the interference fringe becomes below the permissible value during the measurement. The set permissible value of the contrast depends on the measuring method and the purpose.

An estimate of the wavefront tilt component (step 110) calculates a wrapped phase on a pupil from one sheet of interference fringe so as to estimate the wavefront tilt of a single bucket. The wavefront tilt can be estimated within a short measuring time by calculating the phase from a single bucket through calculating of the wrapped phase on the pupil from five or nine buckets of interference fringes, which usually provides high accuracy. The wavefront can be obtained by calculating the wrapped phase on the pupil from the interference fringes and by unwrapping the phase. The inclination element on this wavefront corresponds to the tilt component. The system of FIG. 7 generates a Y tilt Ty of 40λ and an X Tilt Tx of 0λ. Next, the amount of the relative positional offset is estimated. That is, a condensing point of the zeroth order beam offsets from a position of the pinhole center when a tilt is different from a design value. The offset amounts are given respectively by the next equations:

$$X\,shift = \frac{Tx \times \lambda}{NA}$$
$$Y\,shift = \frac{(Ty - 40) \times \lambda}{NA}.$$

Step 112 moves to step 114, if the mask drift (i.e., or the alignment accuracy) calculated in step 110 is higher than the permissible value, and moves to step 120 if it is below the permissible value.

Next, step 114 moves the stage 22 only by the amount of relative positional offset calculated in step 110. The tilt is reconfirmed (step 116) after the movement, and it is confirmed whether the amount of the relative positional offset is below the permissible value (step 118). If it is above the permissible value, step 118 shifts to step 114. On the other hand, step 118 shifts to step 104 so as to measure the interference fringes, if the amount is below the permissible value.

The decreased contrast is attributed to clogging of the pinhole, if the contrast of the interference fringe measured again is not enough. It can be confirmed that the alignment accuracy is below the permissible value by executing steps 110 and 112 again. When the alignment accuracy is below the permissible value in step 112, step 112 shifts to step 120.

Step 120 is to exchange the pinhole 20a in the second mask 20. An exchange of the pinhole may be an exchange of a mask or a movement to another pair of a pinhole and a window in the second mask.

The measuring system where a relative positional offset of the condensing point and the pinhole mask 20 exists and the pinhole is clogged can efficiently judge the exchange of the pinhole 20a by executing a series of processes according to the flowchart of such FIGS. 1 and 3. As a result, the interference fringe with high contrast can be acquired. Moreover, the misdetection caused because the pinhole 20a is clogged and the shape changes is prevented.

Figure 5A:
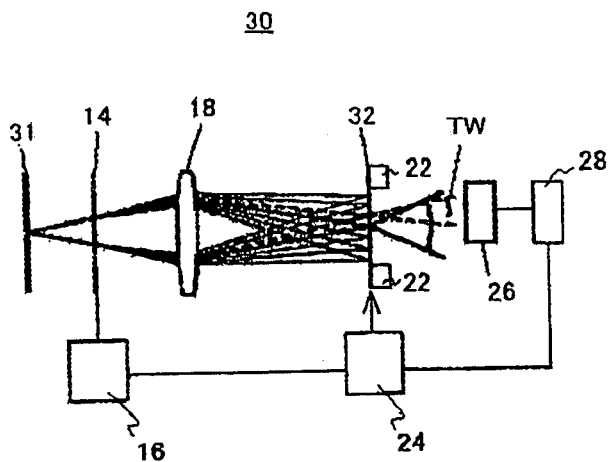
FIGS. 5A-5D are optical path views for explaining the LDI of an embodiment according to the present invention.
Figure 5B:
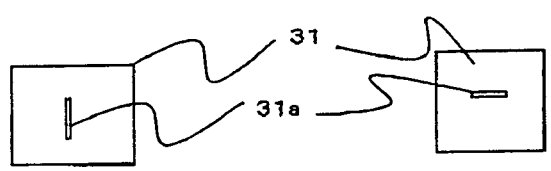
Figure 5C:
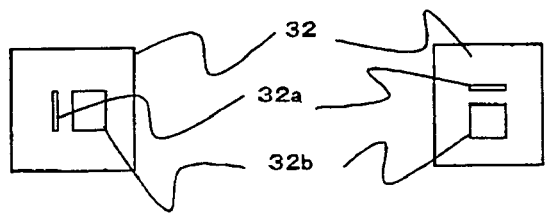
Figure 5D:
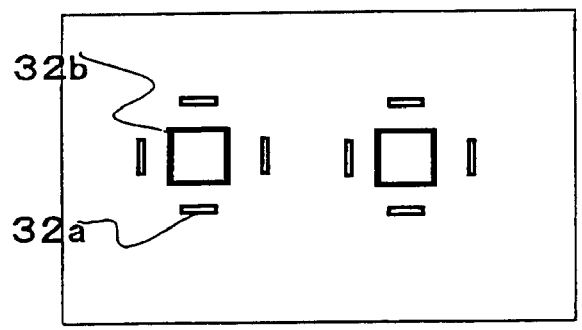

A description will be given of another embodiment according to the present invention. The above embodiment uses the PDI interferometer, but this embodiment uses the LDI interferometer. Hereafter, a measuring apparatus 30 using the LDI technique in one embodiment of the present invention will be discussed with reference to FIGS. 5A-5D. FIG. 5A is a schematic optical path view of the measuring apparatus 30. The shape of the first mask 12 and the second mask 20 in the measuring apparatus 30 is different from that of the measuring apparatus 10 of FIG. 4. In the measuring apparatus 30, the first mask 31 includes a slit 31a in FIG. 5B. Here, FIG. 5B is a schematic plan view of the first mask 31. The second mask 32 includes a slit 32a and a window 32b for measuring light to be detected, as shown in FIG. 5C. The second mask 32 may arrange some slits in one window, as shown in FIG. 5D.

In the measuring apparatus 30, the wavefront shot from the mask 31 has an element almost equal to an ideal spherical wave about the direction of the width of the slit 31a, that is, the direction of a short dimension. Therefore, when the wavefront element of the direction of the slit width is used, the wavefront aberration of the projection optical system 18 can be measured in the LDI interferometer by the same principle as that of the PDI interferometer. However, because the wavefront aberration naturally obtained is limited to the element of the direction of the slit width, another one slit where the direction of the slit rotated by ninety degrees is necessary to measure the wavefront aberration in the direction of the length (direction of long dimension) of the slit. The wavefront aberration of the projection optical system 18 can be measured by synthesizing the wavefront aberration obtained respectively in these slits.

When a concrete principle is described, light generated from the light source (not shown) condenses to the slit 31 in the first mask 12 according to a condenser apparatus shown in FIG. 5B. The measuring light after the pinhole 12a is passed forms a standard spherical wave and faces the projection optical system 18. The diffraction grating 14 arranged between the first mask 12, and the projection optical system 18, is arranged parallel to a direction perpendicular to the paper surface, divides the measuring light vertically in the paper surface, and turns the light toward an orientation corresponding to the pitch of the diffraction grating.

The projection optical system 18 condenses each diffraction light into the image surface. The zeroth order beam of large quantities condenses to the slit 32a of the second mask 32 and the first diffracted order beam of small quantities condenses to the window 32b in the light condensed by the projection optical system 18. The zeroth order beam becomes a wavefront with the same element as a spherical wave that has no aberration in the direction of the slit width by passing the slit 32a at least one of two light beams that have passed the second mask 32. The first diffracted order beam becomes a wavefront with aberration information of the projection optical system 18 because it passes the window 32b with a big opening from the diffraction limit. The zeroth order beam and the first diffracted order beam form an interference fringe (a wavefront to be detected TW), as well as the case of the PDI after passing the second mask 32, and these beams are observed by the detector 26. The aberration in the direction of the width of the slit in the projection optical system 18 can be measured from this interference fringe.

The slit 31a of the first mask 31 and the slit 32a of the second mask 32 are very small, and the wavefront of the light after the slit is shot becomes an ideal spherical wave very near about the element of the direction of the width of the slit. Therefore, the absolute value of the aberration of the projection optical system 14 can be guaranteed with high accuracy. High reproducibility can be achieved because the zeroth order beam and the first diffracted order beam almost pass the same optical path.

The interference fringe generated by the second mask 32 is detected by the detector 26, and can request the wavefront aberration by the calculation. The light passing the slit of the second mask 32 generates an ideal spherical wave to one dimension in the width direction of the slit. Therefore, the wavefront obtained by one measurement is a correct wavefront only in the direction of the slit of a short dimension.

The wavefront aberration is measured based on the flow of FIG. 2B to obtain the wavefront where the target optical system is correct. First of all, "Routine A" is executed by using the first slit. The wavefront aberration of the projection optical system 18 is acquired by executing "Routine A" using a slit used for the first measurement where the direction is different by ninety degrees in the slit, and by executing the synthesis (step 108) of the wavefront of the first measurement and the wavefront of the second measurement. At this time, "Routine A" is shown in FIG. 3, the first mask 12 was replaced with the first mask 31 and the second mask 20 was replaced with the second mask 32 in "Routine A" explained in the embodiment above of the PDI technique.

Figure 2:
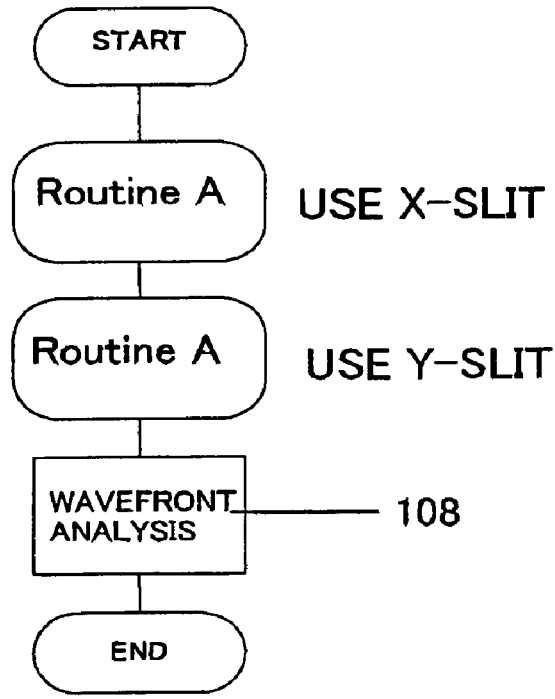
FIG. 2 shows a measuring flowchart of an LDI technique.
Figure 8:
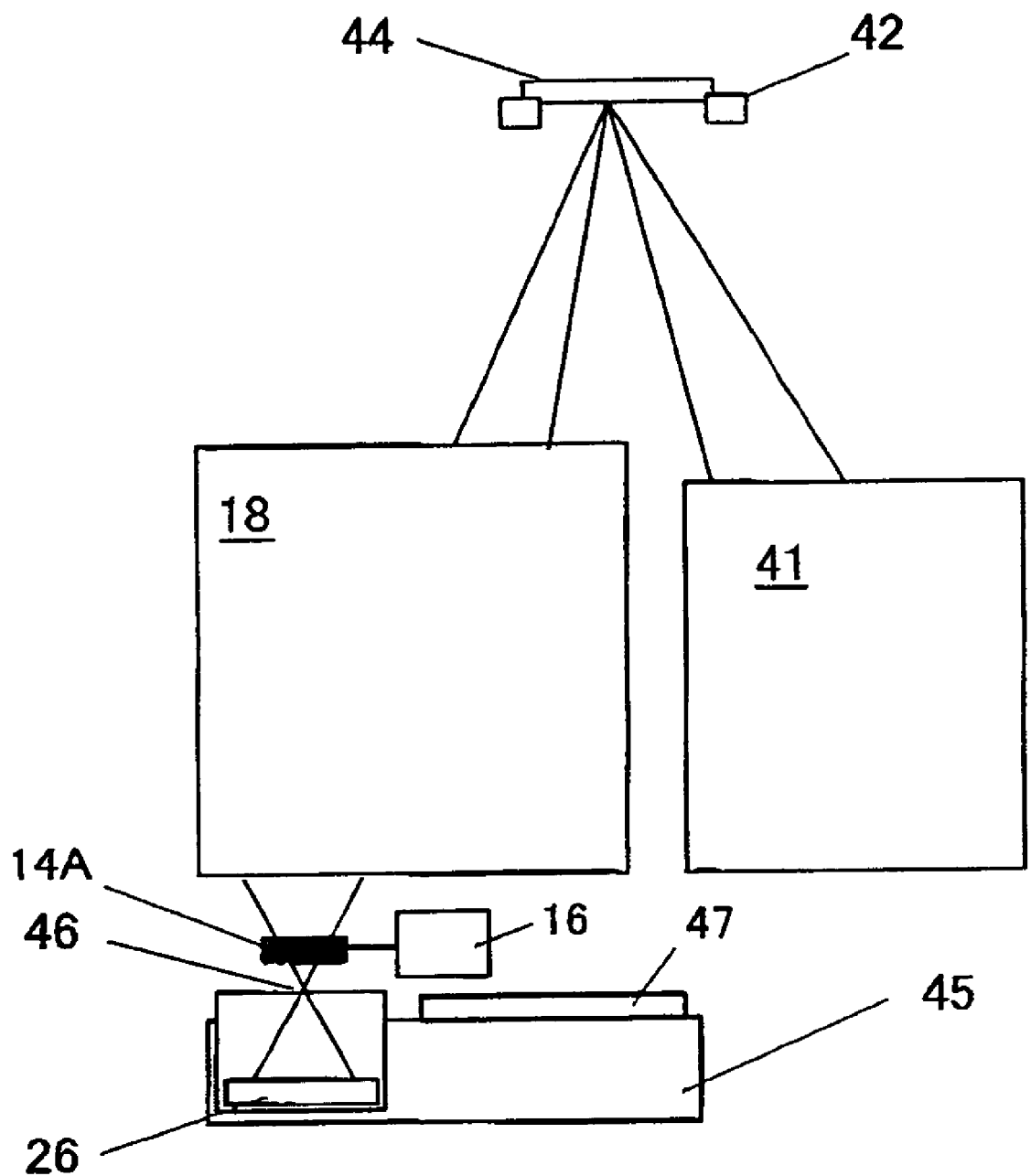
FIG. 8 is an optical path view for explaining an exposure apparatus of an embodiment according to the present invention.

The measuring system where a relative positional offset of a condensing point and the slit mask 32 exists and the slit is clogged can efficiently judge the exchange of the slits 32a by executing a series of steps according to the flowchart of FIGS. 2 and 3. As a result, the interference fringe with high contrast can be acquired. A misdetection is caused because slit 32a is clogged and the shape change is prevented. Hereafter, an exposure apparatus of another embodiment according to this present invention is explained with reference to FIG. 8. Here, FIG. 8 is a schematic clog view of the exposure apparatus 40 using EUV light as exposure light. However, the exposure apparatus of the present invention is not limited to the use of EUV light.

Reference numeral 41 is an illumination apparatus including the light source, reference numeral 42 is a reticle stage, and reference numeral 44 is a reticle, and the reticle may mean the first mask 12 and a reticle where the circuit pattern of the semiconductor device (e.g., a semiconductor chip, a liquid crystal panel, and a CCD, etc., such as ICs and LSIs) is arranged. (However, the pinhole 12a is necessary in this case). Reference numeral 18 is a projection optical system that is the target optical system, reference numeral 45 is a wafer stage, reference numeral 14A is a diffraction grating (optical division means), the diffraction grating may be arranged on a reticle stage side though is shown on a wafer stage 45 side in FIG. 8. The diffraction grating 14A includes the structure similar to the diffraction grating 14 shown in FIG. 4, and two patterns with an orthogonal direction of the lattice. Reference numeral 46 is a pattern surface where the pinhole 20a and the window 20b are arranged, reference numeral 26 is a detector and reference numeral 47 is an object to be exposed (i.e., a wafer in this embodiment). The pattern surface 46 and the detector 26 are an integral structure, being arranged on the wafer stage 45.

By the above composition, as well as that shown in FIG. 4, the illumination system 41 illuminates the mask 44, the diffraction grating 14A divides light of a wavefront wherein only one direction shot from the pinhole 12a is a sphere via the projection optical system 18, the zeroth order beam injects into the pinhole 20a of the pattern 46, the first diffracted order beam injects into the window 20b, and the detector 26 detects an interference fringe. The interference fringe acquired by the detector 26 is obtained, and the phase of the interference fringe is obtained by a Moire method by using a calculation means (not shown), because the interference fringe includes a TLT fringe that corresponds to a separation angle separation between the zeroth order beam and the first order beam. Also, the phase of the interference fringe can be obtained by the phase-shift method because a scanning means (not shown) vertically scans the diffraction optical element to an optical axis of the projection optical system 18. The phase-shift method 16 moves the diffraction grating 14A, and an aberration characteristic within an angle of view of a projection optical system is measured similar to the aberration measurement in several points, within the angle of view of the projection optical system 18. It is a composition in which the aberration measuring function is added easily by using the reflection pattern as a mask in the projection exposure apparatus of this embodiment.

A description will be given of the method of correcting the aberration in one embodiment according to the present invention as follows. The exposure apparatus 40 can move plural optical elements (not shown) in the direction of an optical axis and/or the orthogonal direction of an optical axis. The exposure apparatus 40 can correct an aberration (especially, five aberrations of Seidel) of one or more value(s) in the projection optical system by driving one or more optical element(s) based on aberration information obtained by this embodiment of a driving apparatus (not shown) for adjusting aberration. The means for adjusting the aberration of the projection optical system 40 includes not only a movable lens, but also, well-known factions like a movable mirror (when the optical system is a catadioptric system and a mirror system), a tilting parallel monotony, space that can control pressure, or a surface correction by the actuator, etc.).

Figure 9:
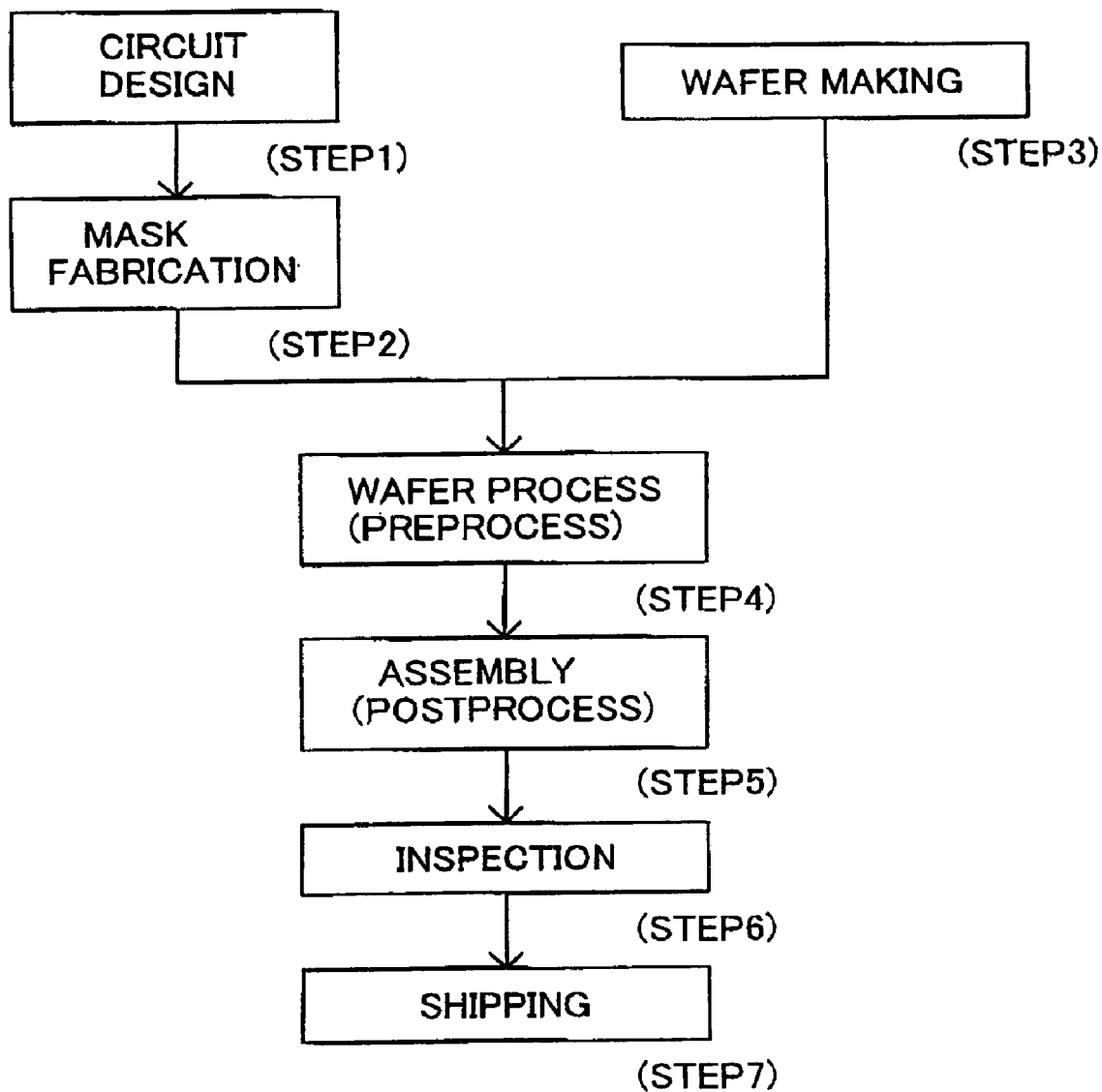
FIG. 9 is a flowchart for explaining fabrication of devices (i.e., semiconductor chips, such as ICs and LSIs, LCDs, CCDs, etc.).

A description will be given of an embodiment of a device fabrication method using the above projection exposure apparatus 40. FIG. 9 is a flowchart for explaining fabrication of devices (i.e., semiconductor chips, such as ICs and LSIs, LCDs, CCDs, etc.). A description will now be given of fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 10:
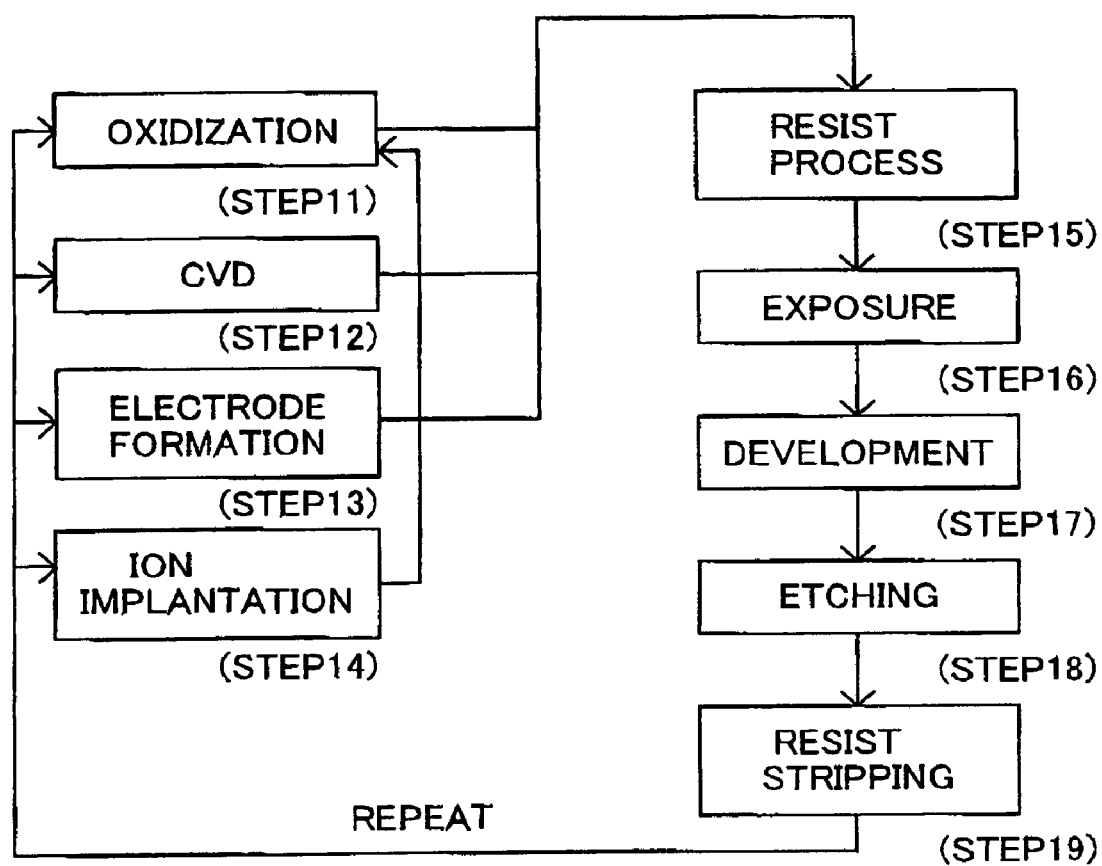
FIG. 10 is a detailed flowchart of Step 4 for the wafer process shown in FIG. 9.

FIG. 10 is a detailed flowchart of the wafer process in Step 4 shown in FIG. 9. Step 11 (oxidation) oxidizes the wafer's surface. Step 12 (CVD) forms an insulating film on the wafer's surface. Step 13 (electrode formation) forms electrodes on the wafer by vapor deposition, and the like. Step 14 (ion implantation) implants ions into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 17 (etching) etches parts other than a developed resist image. Step 19 (resist stripping) removes unused resist after etching. These steps are repeated, and multilayer circuit patterns are formed on the wafer 47. The fabrication method of the instant embodiment makes the effective light source distribution uniform, and manufactures high-quality devices with high throughput.

Then, the present invention provides a measuring method more highly accurate than the prior art, and provides the ability to measure the wavefront of the target optical system using the interference measuring method, an apparatus using interference, an exposure method and apparatus using the same, and device fabrication.

What is claimed is:

1. A measuring method for measuring an interference fringe, said method comprising the steps of:
    generating a reference wave as a result of transmission through a slit or pinhole in a mask of a portion of light that has passed a target optical system;
    generating the interference fringe between the reference wave and a wave of another portion of light that has passed the target optical system and contains aberration information of the target optical system;
    determining whether contrast of the interference fringe is higher than a predetermined threshold; and
    exchanging the pinhole or the slit when the contrast is below the predetermined threshold.

2. A measuring method according to claim 1, wherein the predetermined threshold of the contrast of the interference fringe is 0.4.

3. An exposing method comprising the steps of:
    calculating a wavefront aberration of a target optical system by using a measuring method;
    adjusting the target optical system based on a calculated wavefront aberration; and
    exposing an object to be exposed with an adjusted target optical system,
    wherein said measuring method comprises the steps of:
    (i) generating a reference wave as a result of transmission through a slit or pinhole in a mask of a portion of light that has passed a target optical system;
    (ii) generating the interference fringe between the reference wave and a wave of another portion of light that has passed the target optical system and contains aberration information of the target optical system;
    (iii) determining whether contrast of the interference fringe is higher than a predetermined threshold; and
    (iv) exchanging the pinhole or the slit when the contrast is below the predetermined threshold.

4. A measuring apparatus for measuring a wavefront of a target optical system, said measuring apparatus comprising:
    a mask that has a slit or pinhole, and is configured to generate a reference wave as a result of transmission through the slit or pinhole in a mask of a portion of light that has passed a target optical system;
    a measuring part for measuring an interference fringe between the reference wave and a wave of another portion of light that has passed the target optical system and contains aberration information of the target optical system;
    a determining part for determining whether contrast of the interference fringe is higher than a predetermined threshold; and
    an exchanging part for exchanging the pinhole or the slit when the contrast is below the predetermined threshold.

5. An exposure apparatus for exposing a pattern of a mask onto an object to be exposed by using a light beam, said exposure apparatus comprising:
    a projection optical system for projecting the pattern onto the object; and
    a measuring apparatus for detecting a wavefront aberration of said projection optical system by using the light beam and an interference,
    wherein said measuring apparatus includes:
    (i) a mask that has a slit or pinhole and is configured to generate a reference wave as a result of transmission through the slit or pinhole of a portion of light that has passed said projection optical system;
    (ii) a measuring part for measuring an interference fringe between the reference wave and a wave of another portion of light that has passed said projection optical system and contains aberration information of said projection optical system;
    a determining part for determining whether contrast of the interference fringe is higher than a predetermined threshold; and
    an exchanging part for exchanging the pinhole or the slit when the contrast is below the predetermined threshold.

6. An exposure apparatus according to claim 5, wherein the light is extreme ultraviolet light having a length of 20 nm or less.

7. A device fabrication method comprising the steps of:
    exposing an object using an exposure apparatus according to claim 5; and
    performing a development process for the object exposed.

* * * * *

UNITED STATES PATENT AND TRADEMARK OFFICE
CERTIFICATE OF CORRECTION

PATENT NO. : 7,283,252 B2  
APPLICATION NO. : 10/996381  
DATED : October 16, 2007  
INVENTOR(S) : Seima Kato It is certified that error appears in the above-identified patent and that said Letters Patent is hereby corrected as shown below:

COLUMN 3:
  Line 16, "on" should be deleted.
  Line 19, "detection" should read -- detecting --.

COLUMN 6:
  Line 18, "Ali" should read -- Δli --.

COLUMN 8:
  Line 15, "is" should read -- are --.

COLUMN 9:
  Line 1, "the" should read -- through the --.

Signed and Sealed this

Twenty-seventh Day of May, 2008

JON W. DUDAS  
*Director of the United States Patent and Trademark Office*